(12) United States Patent
Speckels et al.

(10) Patent No.: US 8,835,299 B2
(45) Date of Patent: Sep. 16, 2014

(54) PRE-SINTERED SEMICONDUCTOR DIE STRUCTURE

(75) Inventors: Roland Speckels, Kamen (DE); Lars Böwer, Dortmund (DE); Nicolas Heuck, Cremlingen (DE); Niels Oeschler, Möhnesee (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 13/597,311

(22) Filed: Aug. 29, 2012

(65) Prior Publication Data

US 2014/0061909 A1    Mar. 6, 2014

(51) Int. Cl.
*H01L 21/30* (2006.01)
*H01L 21/46* (2006.01)
*H01L 23/00* (2006.01)

(52) U.S. Cl.
CPC ............... *H01L 24/83* (2013.01); *H01L 24/28* (2013.01)
USPC ......................................... 438/610; 438/455

(58) Field of Classification Search
USPC ........................................................ 438/610
See application file for complete search history.

(56) References Cited

U.S. PATENT DOCUMENTS

| | | | |
|---|---|---|---|
| 5,893,511 A | 4/1999 | Schwarzbauer | |
| 7,682,875 B2 | 3/2010 | Guth et al. | |
| 2005/0136638 A1* | 6/2005 | Voss-Kehl et al. | 438/610 |
| 2005/0247760 A1 | 11/2005 | Palm | |
| 2009/0023250 A1* | 1/2009 | Speckels et al. | 438/118 |
| 2009/0294963 A1 | 12/2009 | Guth et al. | |
| 2012/0261819 A1* | 10/2012 | Brunschwiler et al. | 257/738 |
| 2013/0049204 A1* | 2/2013 | Oeschler et al. | 257/772 |

FOREIGN PATENT DOCUMENTS

| | | |
|---|---|---|
| DE | 102004019567 B3 | 1/2006 |
| DE | 102004056702 B3 | 3/2006 |
| EP | 0764978 A2 | 3/1997 |

OTHER PUBLICATIONS

Wang, T "Low-Temperature Sintering with Nano-Silver Paste in Die-Attached Interconnection" Journal of Electronic Materials Oct. 2007, vol. 36, Issue 10, pp. 1333-1340.*

Lu, G. Q. "A lead-free, low-temperature sintering die-attach technique for high-performance and high-temperature packaging" Proceeding of the Sixth IEEE CPMT Conference on High Density Microsystem Design and Packaging and Component Failure Analysis, 2004. HDP '04 Jul. 2004 pp. 42-46.*

(Continued)

*Primary Examiner* — Yu-Hsi D Sun
*Assistant Examiner* — Grant Withers
(74) *Attorney, Agent, or Firm* — Murphy, Bilak & Homiller, PLLC

(57) ABSTRACT

A sintered connection is formed by pressing a semiconductor die against a substrate with a dried sintering material interposed between the substrate and the semiconductor die, the dried sintering material having sintering particles and a solvent. The substrate is heated to a temperature below a sintering temperature of the dried sintering material while the semiconductor die is pressed against the substrate to form local sinter connections between adjacent ones of the sintering particles. The local sinter connections collectively provide a stable joint that fixes the semiconductor die to the substrate prior to sintering. A sintered connection is then formed between the semiconductor die and the substrate from the dried sintering material, after the stable joint is formed.

20 Claims, 7 Drawing Sheets

(56) References Cited

OTHER PUBLICATIONS

Zhang, Z "Pressure-Assisted Low-Temperature Sintering of Silver Paste as an Alternative Die-Attach Solution to Solder Reflow" IEEE Transactions on Electronics Packaging Manufacturing, vol. 25, No. 4, Oct. 2002 pp. 279-283.*

Bai, John "Low-Temperature Sintered Nanoscale Silver as a Novel Semiconductor Device-Metallized Substrate Interconnect Material" IEEE Transactions on Components and Packaging Technologies, vol. 29, No. 3, Sep. 2006 pp. 589-593.*

Lei, T "Low-Temperature Sintering of Nanoscale Silver Paste for Attaching Large-Area (>100mm2) Chips" IEEE Transactions on Components and Packaging Technology, vol. 33, No. 1, Mar. 2010 pp. 98-104.*

Reinhold Bayerer. "Fixing Semiconductor Die in Dry and Pressure Supported Assembly Processes." U.S. Appl. No. 13/208,893, filed Aug. 12, 2011.

* cited by examiner

PRE-SINTERED SEMICONDUCTOR DIE STRUCTURE

TECHNICAL FIELD

The instant application relates to sintering, and more particularly to forming high integrity sintered connections.

BACKGROUND

Sintering is a solid state process that transforms compacted mechanical bonds between powder particles into solid metallurgical bonds between the particles when heated. Sintering is a widely used die-to-substrate joining technique which allows for an increased lifetime and an enhanced power density of power modules. The die-substrate joint formed by sintering is based on metal inter-diffusion at an enhanced surface area of micrometer or nanometer-sized particles. These metal particles are typically compressed at high temperatures, with or without applied pressure. Common sintering pastes used for joining dies to substrates consist of silver particles coated by organic complexes and organic ingredients such as solvents to hold the silver particles together.

One conventional sinter die attachment technique involves firmly placing the dies onto a substrate with a wet silver paste coating. The organic components of the wet silver paste provide sufficient adhesion for holding the dies to the substrate. However, during the subsequent sintering process, drying channels are formed as the organic composites evaporate. These channels severely degrade the thermal and electric properties of the sintered silver layer. Consequently, the reliability requirements, in particular the module life time, cannot be fulfilled.

Most of the solvent can be removed from the silver paste prior to die placement on the substrate by drying the silver paste at an elevated temperature. However, removing most of the solvent from the sintering paste prior to die placement on the substrate renders it difficult to hold the dies in position on the substrate, because the sintering material has poor adhesion qualities once dried. The dies must remain in proper position on the substrate after the placement process and during transport of the substrate to the sintering equipment, which proves difficult when using dried sintering pastes.

SUMMARY

According to the embodiments described herein, stable positioning of dies onto a substrate via a dried sintering material is provided so that the substrate can be transferred to sintering equipment without the dies moving out of position.

According to an embodiment of a method of forming a sintered connection, the method comprises: pressing a semiconductor die against a substrate with a dried sintering material interposed between the substrate and the semiconductor die, the dried sintering material comprising sintering particles and a solvent; heating the substrate to a temperature below a sintering temperature of the dried sintering material while the semiconductor die is pressed against the substrate to form local sinter connections between adjacent ones of the sintering particles, the local sinter connections collectively providing a stable joint that fixes the semiconductor die to the substrate prior to sintering; and forming a sintered connection between the semiconductor die and the substrate from the dried sintering material, after the stable joint is formed.

According to an embodiment of a pre-sintered structure, the pre-sintered structure comprises a substrate, a semiconductor die disposed on the substrate, and a dried sintering material interposed between the substrate and the semiconductor die. The dried sintering material comprises sintering particles and a solvent. The dried sintering material has a porosity greater than 20%. The pre-sintered structure further comprises local sinter connections between adjacent ones of the sintering particles, which collectively fix the semiconductor die to the substrate without a fully sintered connection between the semiconductor die and the substrate.

According to an embodiment of a method of forming a pre-sintered connection, the method comprises: forming a sintering material on a substrate or a semiconductor die to be attached to the substrate, the sintering material comprising sintering particles and a solvent; drying the sintering material above an evaporation temperature of the solvent to form a dried sintering material having a reduced amount of solvent; pressing the semiconductor die against the substrate with the dried sintering material interposed between the substrate and the semiconductor die; and heating the substrate to a temperature below a sintering temperature of the dried sintering material while the semiconductor die is pressed against the substrate to form local sinter connections between adjacent ones of the sintering particles, the local sinter connections collectively providing a stable joint that fixes the semiconductor die to the substrate prior to sintering.

According to another embodiment of a method of forming a sintered connection, the method comprises: forming a sintering material on a substrate or a semiconductor die to be attached to the substrate, the sintering material comprising sintering particles and a solvent; drying the sintering material above an evaporation temperature of the solvent to form a dried sintering material having a reduced amount of solvent; pressing the semiconductor die against the substrate with the dried sintering material interposed between the substrate and the semiconductor die; heating the substrate to a temperature below a sintering temperature of the dried sintering material while the semiconductor die is pressed against the substrate to form local sinter connections between adjacent ones of the sintering particles, the local sinter connections collectively providing a stable joint that fixes the semiconductor die to the substrate prior to sintering; and forming a sintered connection between the semiconductor die and the substrate from the dried sintering material, after the stable joint is formed.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Described next are embodiments of mounting a die onto a substrate via a dried sintering material, so that the substrate can be transferred to sintering equipment without the die moving out of position. A sintering paste, porous preform (i.e. pre-made shape of solder specially designed for a particular application), or a porous sintering layer can be deposited on the substrate or die. The sintering material is dried to remove most of the solvent contained in the sintering material. The die is positioned on the substrate before sintering is performed, with the dried sintering material interposed between the die and substrate. In order to sufficiently fix the dies onto the substrate for transport to the sintering equipment, the substrate is preheated to a temperature below the sintering temperature, e.g. below 200° C. for a silver sintering material. Within this temperature window and under sufficient pressure, a sufficiently stable joint is achieved between the die and substrate. The stable joint is produced by pre-sintering the dried sintering material, providing sufficient adhesion between the die and substrate. During the pre-sintering process, reactive surfaces of the small sintering particles form local sinter connections between each other to provide a stable die-to-substrate joint without a fully sintered connection. The final compression to a dense (sintered) connection layer is performed during a subsequent sintering step.

Figure 1:
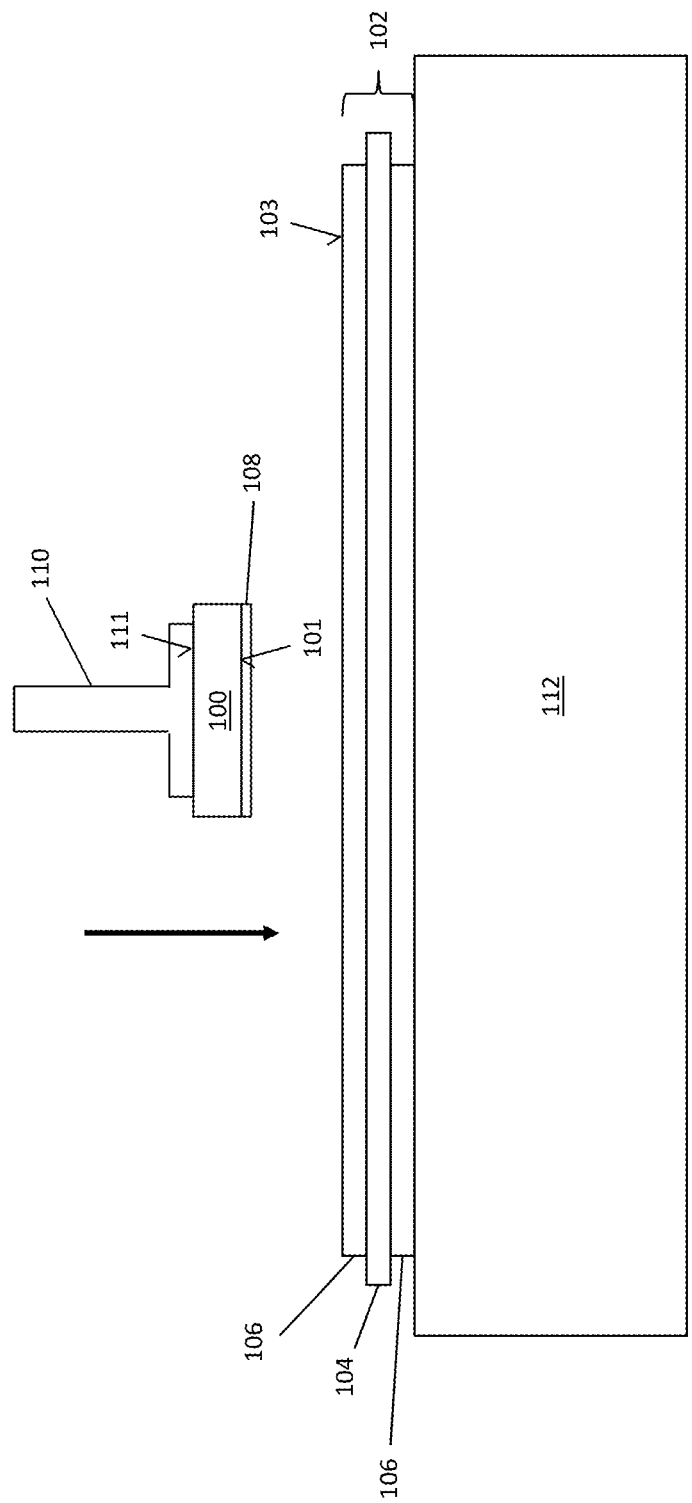
FIG. 1 illustrates a perspective view of a die being mounted to a substrate during a pre-sintering process according to an embodiment.
Figure 2:
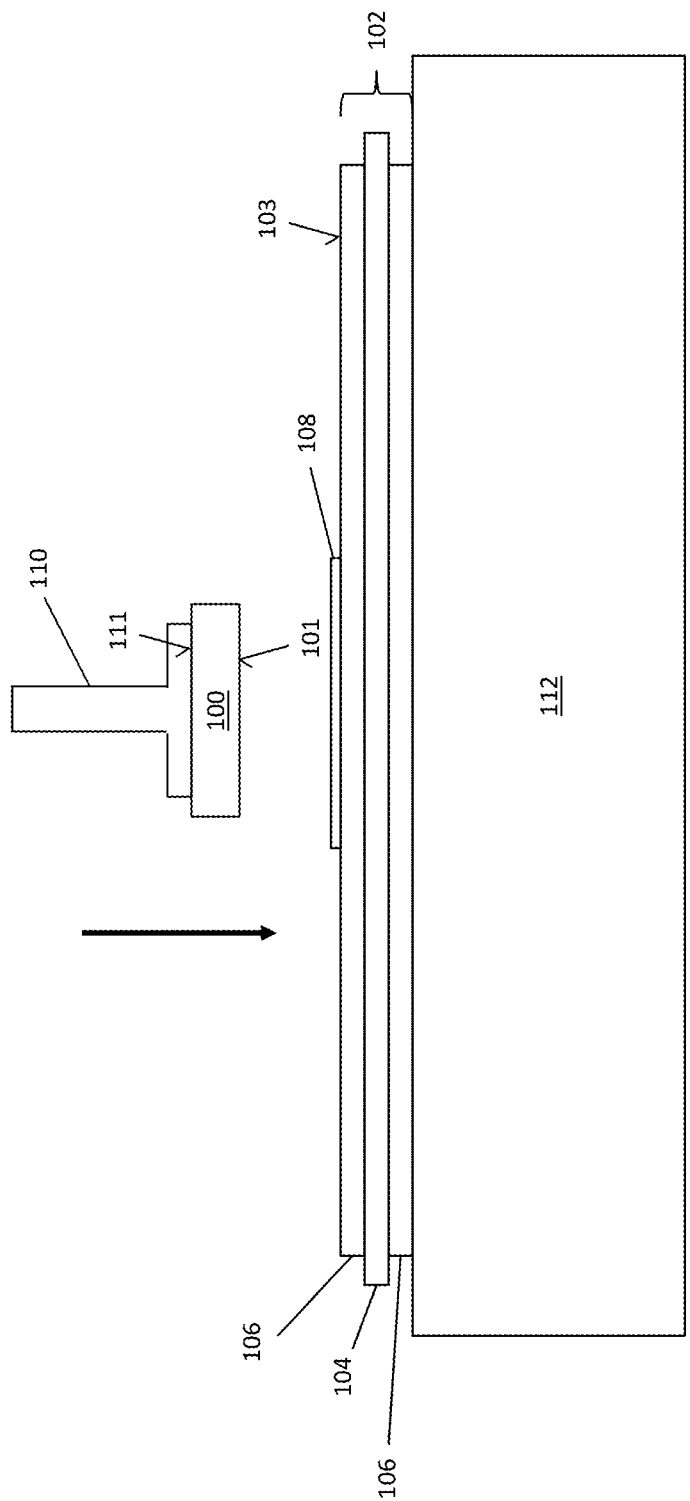
FIG. 2 illustrates a perspective view of a die being mounted to a substrate during a pre-sintering process according to another embodiment.
Figure 3:
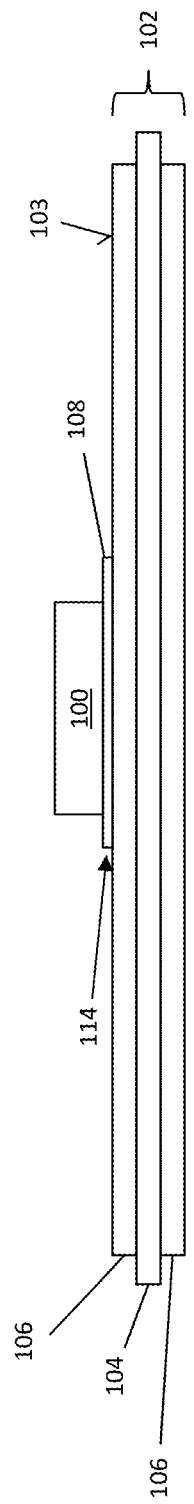
FIG. 3 illustrates a perspective view of a pre-sintered structure including a die mounted to a substrate via local sinter connections according to an embodiment.

In more detail, FIGS. 1 through 3 illustrate an embodiment of a method of forming a pre-sintered connection between a semiconductor die 100 and a substrate 102 so that the substrate 102 can be transported to a sintering equipment without the die 100 moving out of position. The substrate 102 can include an insulating member 104, such as a ceramic member with upper and lower metallization 106, e.g. as shown in FIGS. 1 through 3. In general, any suitable substrate can be used.

FIG. 1 illustrates one embodiment where a sintering material 108 is formed on a backside 101 of the semiconductor die 100 to be attached to the substrate 102. In some embodiments, the sintering material 108 is a silver paste, porous silver preform or porous silver layer. In general, the sintering material 108 comprises sintering particles of micrometer or nanometer size and organic constituents including a solvent. The sintering particles can be silver particles, copper particles, gold particles, palladium particles, etc. coated with wax or other organic complexes. FIG. 2 illustrates an alternative embodiment where the sintering material 108 is formed on the substrate 102. In each case, the sintering material 108 can be sprayed, vapor deposited or printed (e.g. screen printing) onto the backside 101 of the die 100 or onto the substrate 102. For example, metal grains can be deposited in a vapor deposition process onto the die 100 or substrate 102. Alternatively, the sintering material 108 can be a metal-paste preform placed between the die 100 and substrate 102. The sintering material 108 can cover the die area or be larger than the die area.

The sintering material 108 is dried above an evaporation temperature of the solvent included in the sintering material 108 to form a dried sintering material having a reduced amount of solvent. For example, the sintering material 108 can be dried above 120° C. for many types of solvents to adequately reduce the amount of solvent in the sintering material 108. However, enough solvent remains in the dried sintering material 108 so that the sintering particles sufficiently adhere to each other when applied to the substrate 102 or die 100, and therefore sticks to the die 100 or substrate 102 after application. In one embodiment, the sintering material 108 is dried until at least 80% of the solvent is removed from the sintering material 108.

In one embodiment, the sintering material 108 is a metal paste formed on the semiconductor die 100 as shown in FIG. 1 and the die 100 is heated to a temperature between 150° C. and 250° C. to dry the metal paste and form a dried sintering material 108 on a backside 101 of the semiconductor die 100. In another embodiment, the metal sintering paste 108 is formed on the substrate 102 as shown in FIG. 2 and the substrate 102 is heated to a temperature between 150° C. and 250° C. to dry the metal paste and form a dried sintering material 108 on a side 103 of the substrate 102. In yet another embodiment, the sintering material 108 is a metal paste preform placed between the semiconductor die 100 and the substrate 102, and the substrate 102 is heated to a temperature between 150° C. and 250° C. to dry the metal paste preform and form a dried sintering material 108. Alternatively, the die 100 or substrate 102 can be provided with the dried sintering material 108 already applied.

The die 100 can be picked up by a collet 110, e.g. from a wafer or a tray of dies, and moved over the substrate 102. After the sintering material 108 is dried, the collet 110 presses the semiconductor die 100 against the substrate 102 as indicated by the downward facing arrow shown in FIGS. 1 and 2 so that the dried sintering material 108 is interposed in contact between the substrate 102 and the die 100. The substrate 102 is then heated to a temperature below the sintering temperature of the dried sintering material 108 via a heating device 112 while the semiconductor die 100 is pressed against the substrate 102. In one embodiment, the substrate 102 is heated to a temperature between the evaporation temperature of the solvent contained in the dried sintering material 108 and the sintering temperature of the material 108. The substrate 102 can be preheated prior to the die 100 being pressed against the substrate 102, heated up during the chip-positioning process, or heated after the die 100 is pressed against the substrate 102. In either case, heating the substrate 102 to a temperature below the sintering temperature of the dried sintering material 108 while the die 100 is pressed against the substrate 102 causes a stable pre-sintered joint 114 to form between the die 100 and substrate 102. The pre-sintered joint 114 includes local sinter connections (so-called 'necks') between adjacent ones of the sintering particles. The local sinter connections 114 are localized regions of the sintering particles where the atoms have diffused across the boundaries of the particles, fusing together these localized regions (or necks) of the sintering particles.

In one embodiment, the semiconductor die 100 is pressed against the substrate 102 at a pressure between 0.2N/mm$^2$ and 5 N/mm$^2$ during heating of the substrate 102 to form the local sinter connections. This can translate to a pressing force greater than 100N for larger dies 100. In general, the collet 110 carrying the die 100 to the substrate 102 is designed to overcome pressures in the range of 10N and more. The pressure rises as the die size increases. For high-performance dies 100 such as IGBTs (insulated gate bipolar transistors) and diodes in the kV class, a pressure of more than 50N may be needed. The pressing force can be applied by pneumatic, hydrostatic or an electric system, or a combination of such systems. The collet 110 can have a flat or structured surface 111 to accommodate the front side layout (topology) of the die 100. The material of the collet 110 can range from soft temperature-stable materials to stiff metals such as steel alloys. The collet 110 applies steady pressure to safely hold and position dies 100 without the risk of damaging the dies 100 during the pre-sintering process.

In one embodiment, the sintering particles contained in the dried sintering material 108 are silver particles, and the substrate 102 is heated to a temperature between 100° C. and 200° C. to form the local sinter connections. In another embodiment, the sintering particles comprise copper, and the local sinter connections are formed in an inert atmosphere with or without the participation of small amounts of oxygen so that the copper sintering particles do not oxidize. The local sinter connections collectively provide a stable joint that fixes the semiconductor die 100 to the substrate 102 prior to sintering. This way, a dried sintering material 108 can be used to hold the die 100 in place on the substrate 102 instead of a wet paste, for transport to the sintering equipment.

The resulting pre-sintered structure is shown in FIG. 3. The dried sintering material 108 is interposed between the substrate 102 and the semiconductor die 100, and comprises sintering particles and a solvent as previously described herein. The dried sintering material 108 has a porosity greater than 20% after the pre-sintering process, e.g. between 60% and 80%. A stable pre-sintered joint 114 is formed between the die 100 and substrate 102, which includes local sinter connections formed between adjacent ones of the sintering particles that collectively fix the semiconductor die 100 to the substrate 102 without a fully sintered connection between the die 100 and the substrate 102. That is, the adhesion force present in the local sinter connections is sufficiently large to hold the die 100 in place while the pre-sintered structure is moved to the sintering equipment. The pre-sintered structure is ready for transport to the sintering equipment after the local sinter connections are formed during the pre-sintering process.

Figure 4:
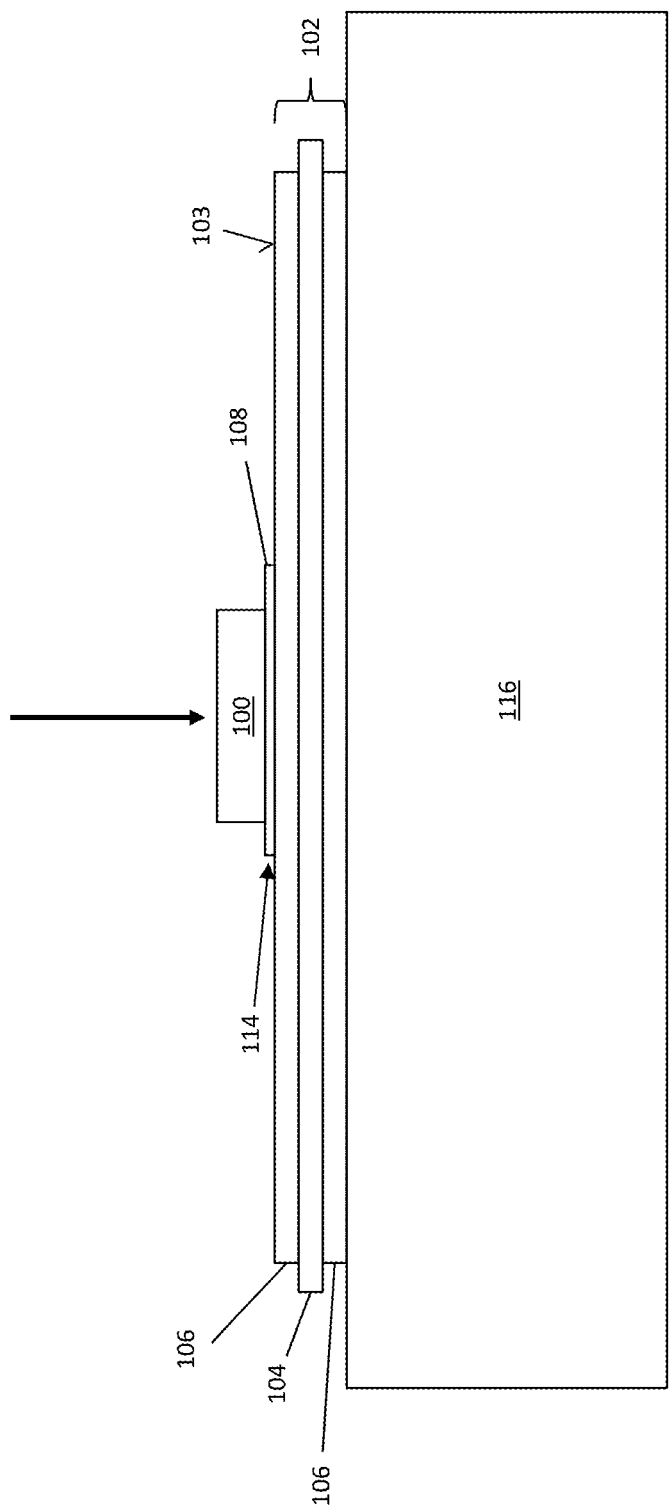
FIG. 4 illustrates a perspective view of the pre-sintered structure of FIG. 3 during a sintering process after the local sinter connections are formed.

FIG. 4 illustrates the pre-sintered structure disposed on a base 116 of a pre-sintering tool during the sintering process. A fully sintered connection 118 is formed between the semiconductor die 100 and the substrate 102 from the dried sintering material 108, after the stable pre-sintered joint 114 is formed. Any conventional sintering equipment and processes can be used to form the fully sintered connection 118. Heating is performed at or above the sintering temperature of the dried sintering material 108, and pressure is applied as indicated by the downward facing arrow in FIG. 4. The sintering process transforms any remaining compacted mechanical bonds and the local sinter connections into solid metallurgical bonds between the particles when sufficiently heated. In one embodiment, the resulting sintered connection 118 has a porosity of less than 20%.

Figure 5A:
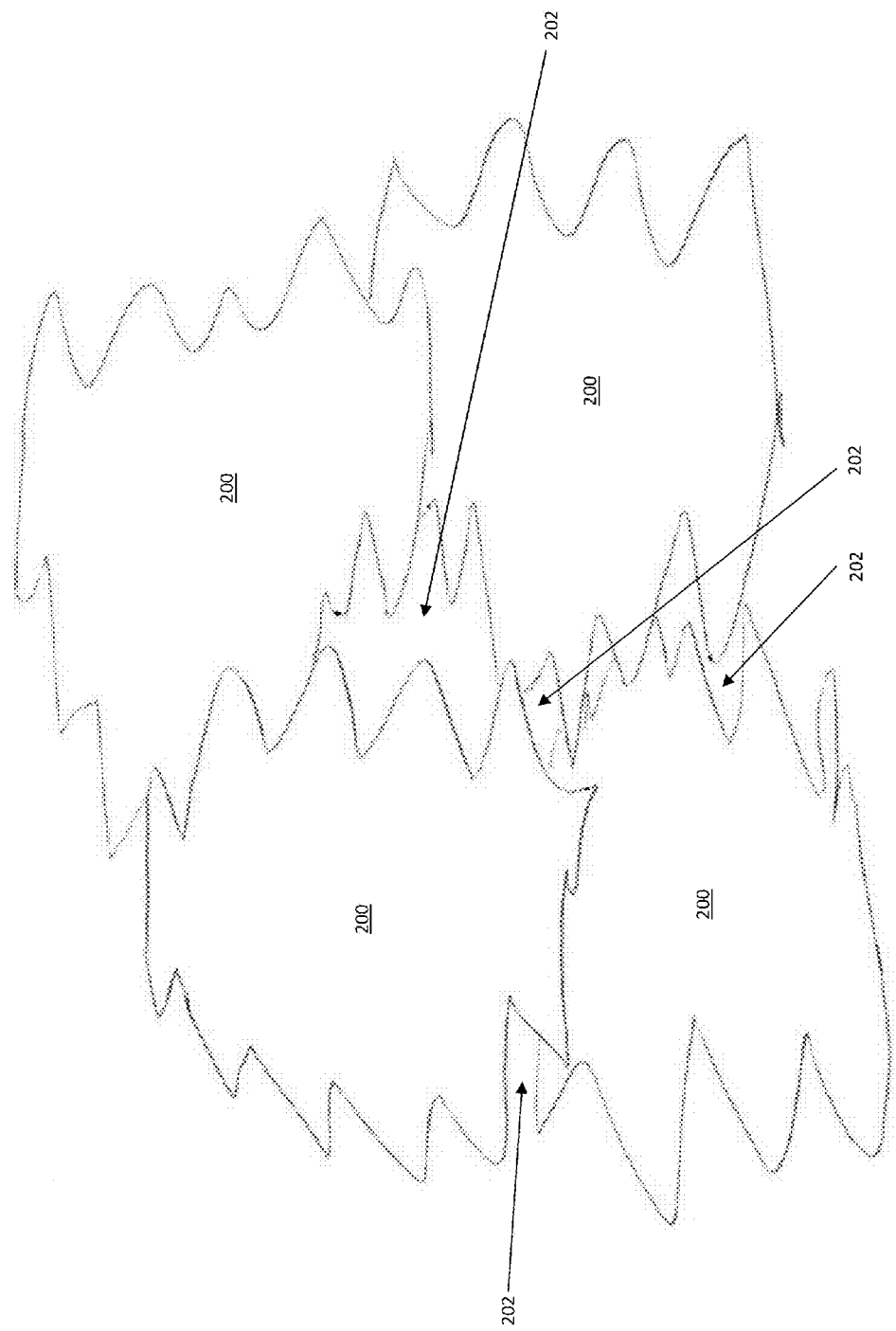
FIGS. 5A through 5C illustrate respective views of sintering particles contained in a sintering material during different phases of a die attach process.
Figure 5B:
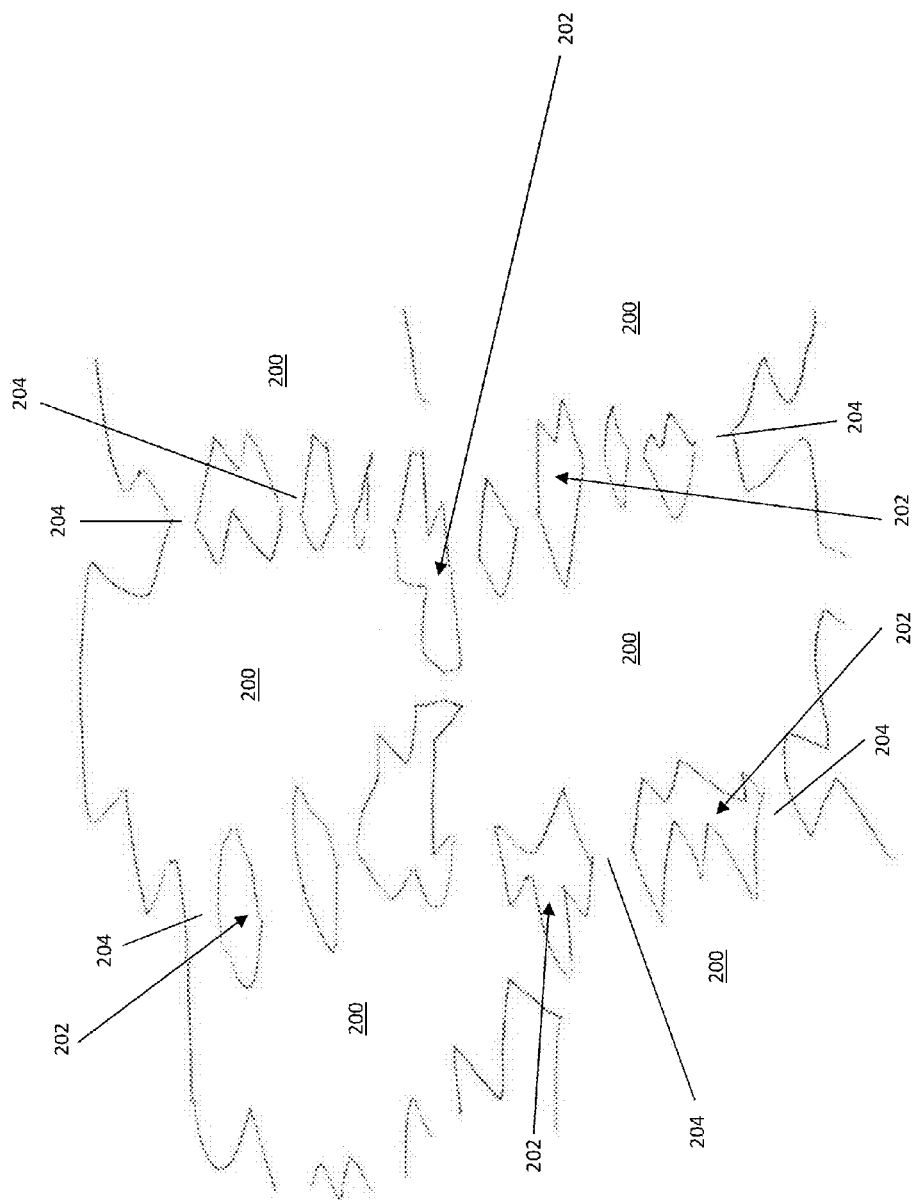
Figure 5C:
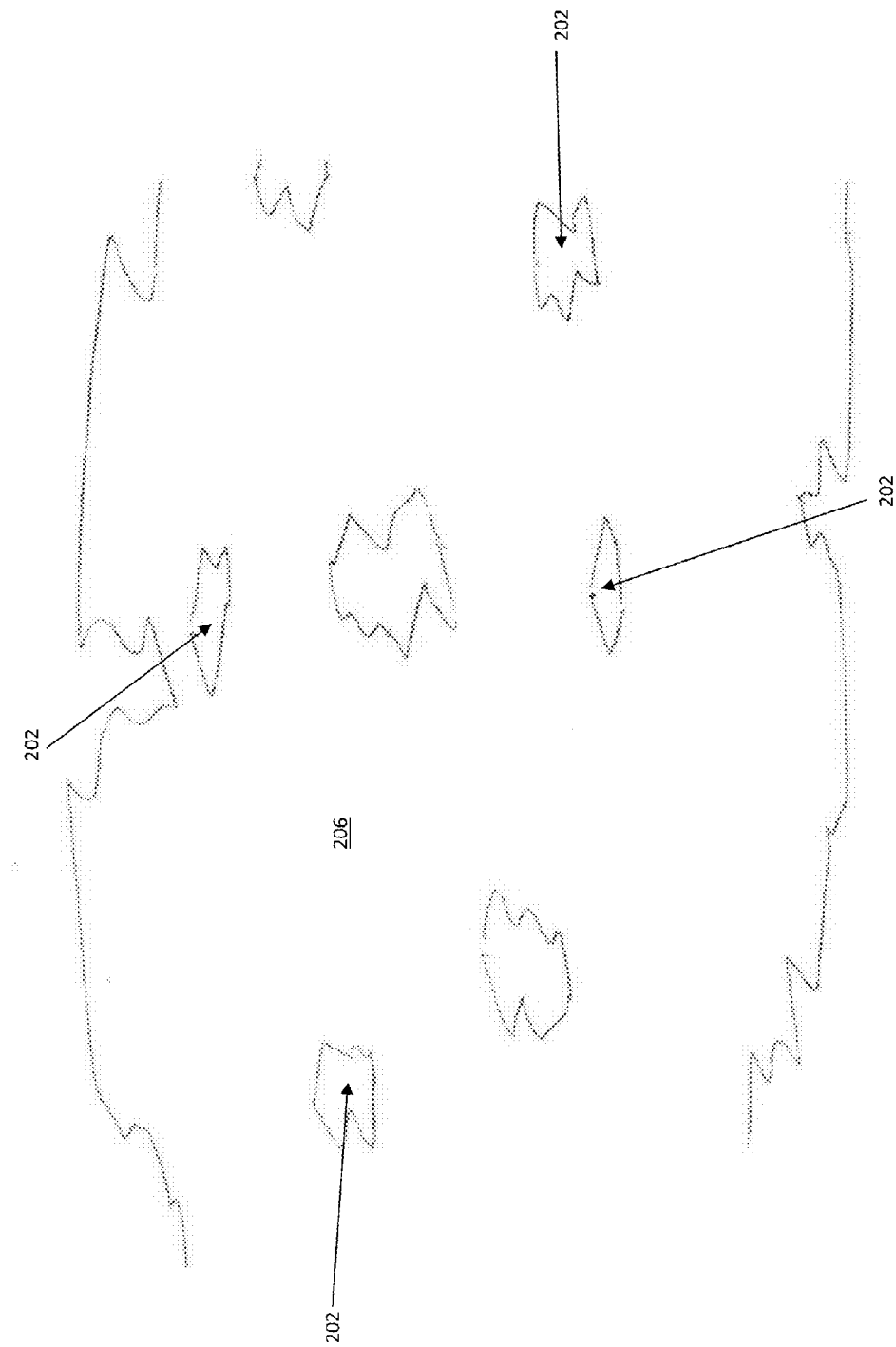

FIGS. 5A through 5C graphically illustrate different states of the sintering particles 200 contained in the sintering material 108 during the pre-sintering and sintering processes previously described herein. The solvent and coating are omitted from FIGS. 5A through 5C for ease of illustration.

FIG. 5A shows the sintering particles 200 after the sintering material 108 is applied to the die 100 or substrate 102 and then dried. The coated sintering particles 200 exhibit basically no connection between adjacent particles. Voids (pores) 202 exist in open spaces around the particles 200.

FIG. 5B shows the sintering particles 200 after the pre-sintering process and prior to full sintering. Local sinter connections (so-called 'necks') 204 form along contact points between adjacent particles 200. However, a fully sintered connection is not formed at this point, and porosity of the dried sintering material 108 remains above 20%. The adhesion force of the local sinter connections 204 is sufficiently large to hold the die 100 in place so that the pre-sintered structure can be transported to the sintering equipment without the die moving out of position.

FIG. 5C shows the state of the sintering particles 200 after the sintering process is complete. Pore volume decreases and the pores 202 become smoother during the sintering process. The pores 202 are eventually replaced by grain boundaries, and the atoms in the sintering particles 200 diffuse across the boundaries of the particles 200, fusing the particles 200 together and creating one solid piece 206, i.e. a fully sintered connection 118 between the die 100 and substrate 102.

Spatially relative terms such as "under", "below", "lower", "over", "upper" and the like, are used for ease of description to explain the positioning of one element relative to a second element. These terms are intended to encompass different orientations of the semiconductor die in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a sintered connection, comprising:
pressing a semiconductor die against a substrate with a dried sintering material interposed between the substrate and the semiconductor die, the dried sintering material comprising sintering particles and a solvent;
heating the substrate to a temperature below a sintering temperature of the dried sintering material while the semiconductor die is pressed against the substrate to form local sinter connections between adjacent ones of the sintering particles, the local sinter connections collectively providing a stable joint that fixes the semiconductor die to the substrate prior to sintering; and
forming a sintered connection between the semiconductor die and the substrate from the dried sintering material, after the stable joint is formed.

2. The method according to claim 1, wherein the sintering particles comprise silver and the substrate is heated to a temperature between 100° C. and 200° C. to form the local sinter connections.

3. The method according to claim 1, wherein the sintering particles comprises copper and both the local sinter connections and the sintered connection are formed in an inert atmosphere with or without the participation of small amounts of oxygen.

4. The method according to claim 1, wherein the substrate is heated to a temperature between an evaporation temperature of the solvent and the sintering temperature of the dried sintering material.

5. The method according to claim 1, wherein the dried sintering material is one of a dried silver paste, porous silver preform or a porous silver layer disposed on the semiconductor die or substrate.

6. The method according to claim 1, wherein the semiconductor die is pressed against the substrate at a pressure between 0.2N/mm² and 5 N/mm² during heating of the substrate to form the local sinter connections.

7. The method according to claim 1, wherein the semiconductor die is pressed against the substrate at a force greater than 100N during heating of the substrate to form the local sinter connections.

8. The method according to claim 1, wherein the sintered connection has a porosity of less than 20%.

9. The method according to claim 1, wherein the dried sintering material has a porosity between 60% and 80%.

10. A method of forming a pre-sintered connection, comprising:
    forming a sintering material on a substrate or a semiconductor die to be attached to the substrate, the sintering material comprising sintering particles and a solvent;
    drying the sintering material above an evaporation temperature of the solvent to form a dried sintering material having a reduced amount of solvent;
    pressing the semiconductor die against the substrate with the dried sintering material interposed between the substrate and the semiconductor die; and
    heating the substrate to a temperature below a sintering temperature of the dried sintering material while the semiconductor die is pressed against the substrate to form local sinter connections between adjacent ones of the sintering particles, the local sinter connections collectively providing a stable joint that fixes the semiconductor die to the substrate prior to sintering.

11. The method according to claim 10, wherein the sintering particles comprise silver and the substrate is heated to a temperature between 100° C. and 200° C. to form the local sinter connections.

12. The method according to claim 10, wherein the sintering particles comprise copper and the local sinter connections are formed in an inert atmosphere.

13. The method according to claim 10, wherein the sintering material is a silver paste.

14. The method according to claim 10, wherein the semiconductor die is pressed against the substrate at a pressure between 0.2N/mm² and 5 N/mm² during heating of the substrate to form the local sinter connections.

15. The method according to claim 10, wherein the semiconductor die is pressed against the substrate at a force greater than 100N during heating of the substrate to form the local sinter connections.

16. The method according to claim 10, wherein the sintering material is a metal paste formed on the semiconductor die, the semiconductor die is heated to a temperature between 150° C. and 250° C. to dry the metal paste and form the dried sintering material on a side of the semiconductor die, and the semiconductor die is pressed against the substrate at the side of the semiconductor die with the dried sintering material.

17. The method according to claim 10, wherein the sintering material is a metal paste formed on the substrate, the substrate is heated to a temperature between 150° C. and 250° C. to dry the metal paste and form the dried sintering material on a side of the substrate, and the semiconductor die is pressed against the substrate at the side of the substrate with the dried sintering material.

18. The method according to claim 10, wherein the sintering material is a metal paste preform placed between the semiconductor die and the substrate and the substrate is heated to a temperature between 150° C. and 250° C. to dry the metal paste preform and form the dried sintering material.

19. The method according to claim 10, wherein the sintering material is dried until at least 80% of the solvent is removed from the sintering material.

20. A method of forming a sintered connection, comprising:
    forming a sintering material on a substrate or a semiconductor die to be attached to the substrate, the sintering material comprising sintering particles and a solvent;
    drying the sintering material above an evaporation temperature of the solvent to form a dried sintering material having a reduced amount of solvent;
    pressing the semiconductor die against the substrate with the dried sintering material interposed between the substrate and the semiconductor die;
    heating the substrate to a temperature below a sintering temperature of the dried sintering material while the semiconductor die is pressed against the substrate to form local sinter connections between adjacent ones of the sintering particles, the local sinter connections collectively providing a stable joint that fixes the semiconductor die to the substrate prior to sintering; and
    forming a sintered connection between the semiconductor die and the substrate from the dried sintering material, after the stable joint is formed.

* * * * *